United States Patent
Choi

(10) Patent No.: US 7,259,057 B2
(45) Date of Patent: Aug. 21, 2007

(54) METHOD FOR FORMING CAPACITOR OF SEMICONDUCTOR DEVICE

(75) Inventor: Hyung Bok Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 137 days.

(21) Appl. No.: 11/124,222

(22) Filed: May 6, 2005

(65) Prior Publication Data

US 2006/0216884 A1    Sep. 28, 2006

(30) Foreign Application Priority Data

Mar. 23, 2005  (KR)  ............ 10-2005-0024040

(51) Int. Cl.
*H01L 21/8242*   (2006.01)
(52) U.S. Cl. .............. 438/238; 257/E21.006; 257/E21.171
(58) Field of Classification Search ........ 438/238; 257/E21.004
See application file for complete search history.

(56) References Cited

U.S. PATENT DOCUMENTS

| | | | | |
|---|---|---|---|---|
| 5,918,129 | A * | 6/1999 | Fulford et al. ............ | 438/289 |
| 5,976,982 | A * | 11/1999 | Levy et al. ............... | 438/692 |
| 5,985,676 | A * | 11/1999 | New .......................... | 438/3 |
| 6,140,203 | A * | 10/2000 | Schuegraf et al. ........ | 438/396 |
| 6,214,661 | B1 * | 4/2001 | Lee et al. .................. | 438/240 |
| 6,251,719 | B1 * | 6/2001 | Wang ........................ | 438/238 |
| 6,284,628 | B1 * | 9/2001 | Kuwahara et al. ........ | 438/459 |
| 6,656,784 | B2 * | 12/2003 | Pakr .......................... | 438/239 |
| 6,764,896 | B2 * | 7/2004 | Okudaira ................... | 438/238 |
| 6,946,406 | B2 * | 9/2005 | Yamazaki et al. ........ | 438/781 |
| 7,148,103 | B2 * | 12/2006 | Hendriks et al. ......... | 438/251 |
| 2005/0095779 | A1 * | 5/2005 | Park et al. ................. | 438/238 |

FOREIGN PATENT DOCUMENTS

| | | |
|---|---|---|
| KR | 20020044000 | 6/2002 |
| KR | 10-20040051298 | 6/2004 |

* cited by examiner

*Primary Examiner*—Walter Lindsay, Jr.
*Assistant Examiner*—Thu-Huong Dinh
(74) *Attorney, Agent, or Firm*—Ladas & Parry LLP

(57) ABSTRACT

Disclosed is a method for forming a capacitor of a semiconductor device capable of improving the film quality of a dielectric film. The method includes the steps of providing a semiconductor substrate having a storage node contact; forming a metal storage electrode on the substrate; forming a dielectric film using any one chosen from a group including a single film made of $HfO_2$, a single film made of $Al_2O_3$, and a lamination film made of $HfO_2$ and $Al_2O_3$ on the metal storage electrode; performing $CF_4$ plasma treatment on the dielectric film; and forming a metal plate electrode on the dielectric film.

15 Claims, 6 Drawing Sheets

METHOD FOR FORMING CAPACITOR OF SEMICONDUCTOR DEVICE

BACKGROUND OF THE INVENTION

1. Field of the Invention

The present invention relates to a method for forming a capacitor of a semiconductor device, and more particularly to a method for forming a capacitor of a semiconductor device capable of improving the film quality of a dielectric film.

2. Description of the Prior Art

As the design rule of memory semiconductor devices becomes smaller, the height of the capacitor (i.e., the electrode height) is continuously increased and the thickness of the dielectric film is reduced to obtain desired charging capacity. This is because the charging capacity is proportional to the area of the electrodes and the dielectric constant of the dielectric film and is inversely proportional to the thickness of the dielectric film corresponding to the gap between the electrodes. Since increase in the electrode height is limited, particularly, recent researches to secure sufficient charging capacity are directly to reducing the thickness of the dielectric film and developing new dielectric film.

In addition, researches to secure sufficient charging capacity are directed not only to the development of a dielectric film itself, but also to using metal as the electrode material, instead of polysilicon. When Ta2O5 film is used as the dielectric material, for example, decrease in thickness of the dielectric film made of Ta2O5 results in increase of leak current if the electrode material is polysilicon. However, if the electrode is metal, both charging capacity and leak current characteristics can be secured by reducing the effective oxide film thickness (Tox), even when the thickness of the dielectric film made of Ta2O5 decreases.

In order to secure sufficient charging capacity to meet the trend of high integration of memory semiconductor devices, therefore, it is inevitable to use a metal electrode. A conventional method for forming an Metal/Insulator/Metal (MIM) capacitor will now be described with reference to FIGS. 1A to 1C, which are sectional views thereof.

Referring to FIG. 1A, an etching stop nitride film 4 is formed on a semiconductor substrate 1 having an interlayer insulation film 2 and a storage node contact 3 formed in the interlayer insulation film 2. A spacer (not shown) made of nitride material is formed on the lateral surface of the storage node contact 3. A cap oxide film 5 is formed on the etching stop nitride film 4. A photoresist pattern 6 is formed on the cap oxide film 5 to define a region in which a storage electrode is to be formed.

Referring to FIG. 1B, the photoresist pattern is used as an etching mask to etch the cap oxide film 5 and the etching stop nitride film 4 to form a hole exposing the storage node contact 3. The photoresist pattern is removed and a metal silicide film, e.g., a titanium silicide film 7 is formed on the surface of the exposed storage node contact 3 in a conventional process.

Referring to FIG. 1C, a metal storage electrode 8 made of, e.g., titanium nitride, is formed on the hole surface including the titanium silicide film 7. A dielectric film 9 and a metal plate electrode 10 are successively formed on the front surface of the substrate including the metal storage electrode 8 to complete the formation of an MIM capacitor 12.

As for the dielectric film of the MIM capacitor 12, a single film made of $HfO_2$ or $Al_2O_3$ having large dielectric constant or a lamination film made of both is generally used.

Although the charging capacity (Cs) and leak current characteristics required in devices of 100-80 nm grade may be satisfied to some degree by using a material having large dielectric constant as the dielectric film and forming a capacitor in MIM structure, it is difficult to satisfy both charging capacity and leak current characteristics as desired, if the design rule of semiconductor devices further decreases in the future, with a material having large dielectric constant as mentioned above. This means that film quality of the dielectric film must be additionally improved.

SUMMARY OF THE INVENTION

Accordingly, the present invention has been made to solve the above-mentioned problems occurring in the prior art, and an object of the present invention is to provide a method for forming a capacitor of a semiconductor device capable of improving the film quality of a dielectric film.

Another object of the present invention is to provide a method for manufacturing a capacitor of a semiconductor device capable of satisfying both charging capacity and leak current characteristics required in devices of 80 nm grade or below by improving the film quality of a dielectric film.

In order to accomplish these objects, there is provided a method for forming a capacitor of a semiconductor device including the steps of providing a semiconductor substrate having a storage node contact; forming a metal storage electrode on the substrate; forming a dielectric film using any one chosen from a group including a single film made of $HfO_2$, a single film made of $Al_2O_3$, and a lamination film made of $HfO_2$ and $Al_2O_3$ on the metal storage electrode; performing $CF_4$ plasma treatment on the dielectric film; and forming a metal plate electrode on the dielectric film.

The storage node contact is made of polysilicon having a metal silicide film on a surface thereof.

The metal storage electrode is made of TiN and is formed with a thickness of 50-1000 Å in any mode chosen from sputtering mode, CVD mode, and ALD mode.

The dielectric film is formed with a thickness of 50-400 Å in Metal Oxide Chemical Vapor Deposition (MOCVD) or Atomic Layer Deposition (ALD) mode.

The $CF_4$ plasma treatment is performed for 60-3600 seconds.

The metal plate electrode is made of TiN or Ru and is formed with a thickness of 500-3000 Å in any mode chosen from sputtering mode, CVD mode, and ALD mode.

According to another aspect of the present invention, there is provided a method for forming a capacitor of a semiconductor device including the steps of providing a semiconductor substrate having a storage node contact of polysilicon material; forming a cap oxide film on the substrate; etching the cap oxide film to form a hole which exposes the storage node contact; forming a metal silicide film on the surface of the exposed storage node contact; forming a metal storage electrode on the surface of the hole including the metal silicide film; forming a dielectric film using any one chosen from a group including a single film made of $HfO_2$, a single film made of $Al_2O_3$, and a lamination film made of $HfO_2$ and $Al_2O_3$ on the metal storage electrode; performing $CF_4$ plasma treatment on the dielectric film; and forming a metal plate electrode on the dielectric film.

The $CF_4$ plasma treatment on the dielectric film is performed for 60-3600 seconds.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
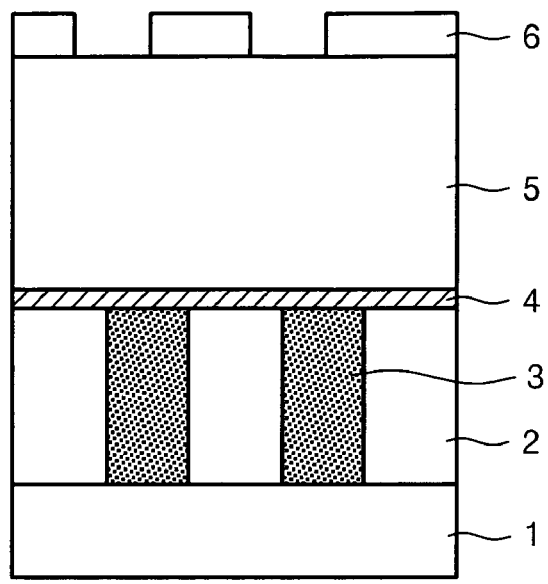
FIGS. 1A to 1C are sectional views showing a conventional method for forming an MIM capacitor.
Figure 1B:
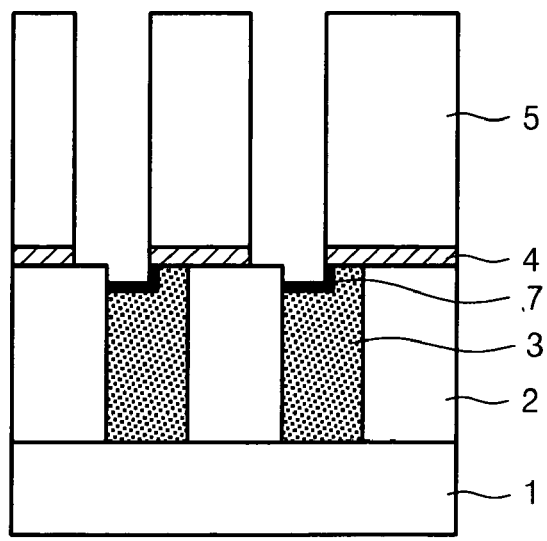
Figure 1C:
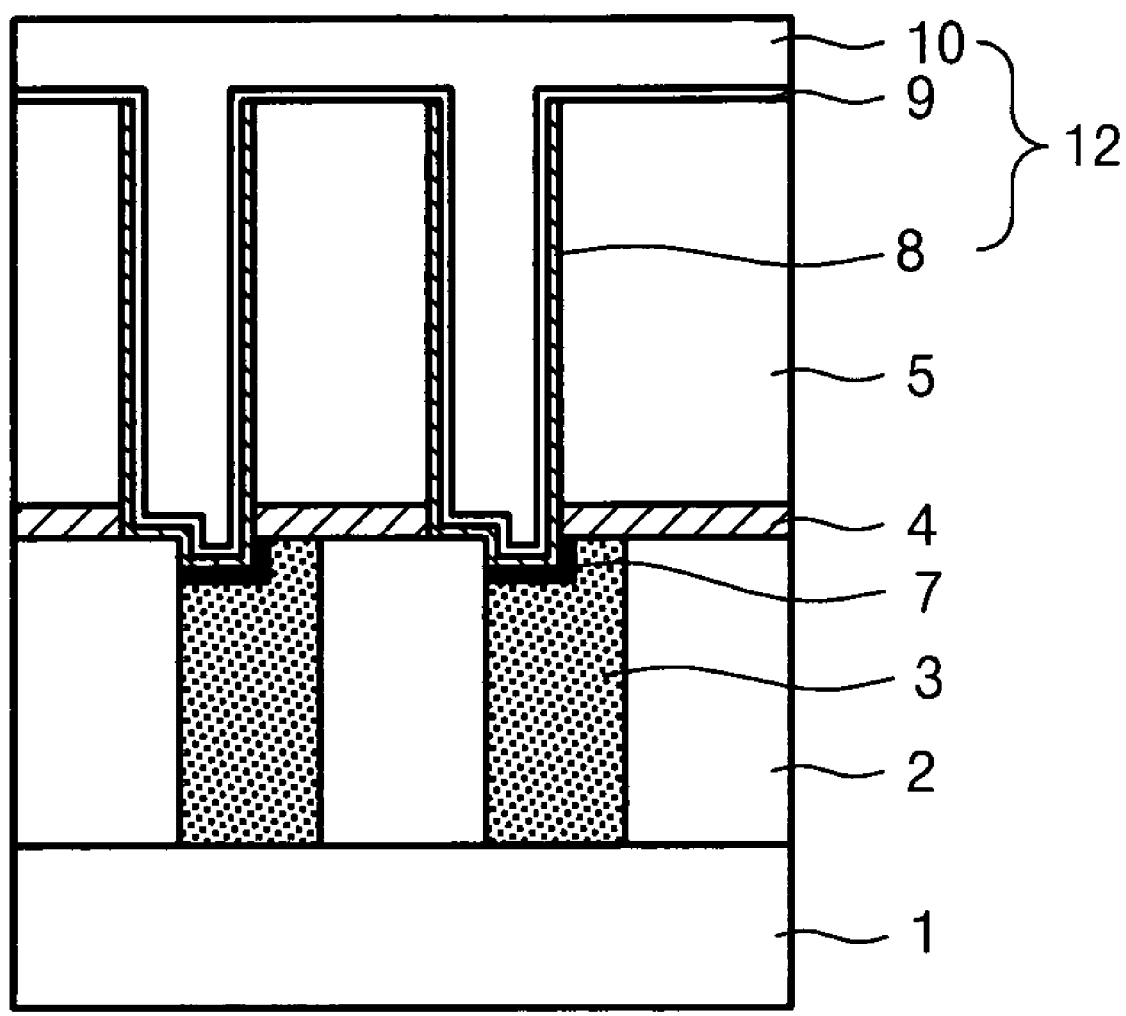

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2E are sectional views showing processes of a method for forming a capacitor of a semiconductor device according to the present invention.

Figure 2A:
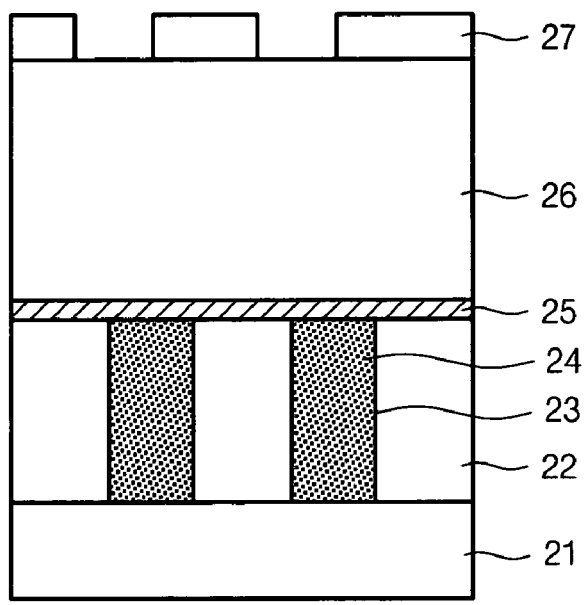
FIGS. 2A to 2E are sectional views showing processes of a method for forming a capacitor of a semiconductor device according to the present invention.

Referring to FIG. 2A, a semiconductor substrate 21 having an underlying pattern (not sown) formed thereon is provided. An interlayer insulation film 22 is formed on the front surface of the substrate to cover the underlying pattern and is etched to form a contact hole 23. A polysilicon film is embedded in the contact hole 23 to form a storage node contact 24.

An etching stop nitride film 25 and a cap oxide film 26 are successively formed on the resulting substrate including the storage node contact 24. The sum of thickness of the etching stop nitride film 25 and the cap oxide film 26 is preferably 6,000-30,000 Å, and the etching stop nitride film 25 has a thickness of 100-2,000 Å. The cap oxide film 26 is made of any one chosen from Borophosphosiliate Glass (BPSG), Phosphosilicate Glass (PSG), and Tetraethyl Orthoslilcate (TEOS) oxide films.

A photoresist is applied, exposed, and developed on the cap oxide film 26 to form a photoresist pattern 27 to define a region in which a storage electrode is to be formed.

Figure 2B:
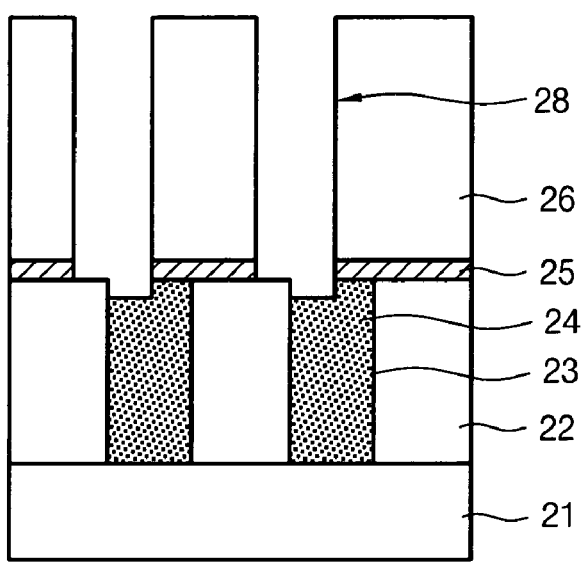

Referring to FIG. 2B, the photoresist pattern is used as an etching mask to etch the cap oxide film 26 and the etching stop nitride film 25 and form a hole 28 for exposing the storage node contact 24. A part of the surface of the exposed storage node contact 24 is selectively etched.

Figure 2C:
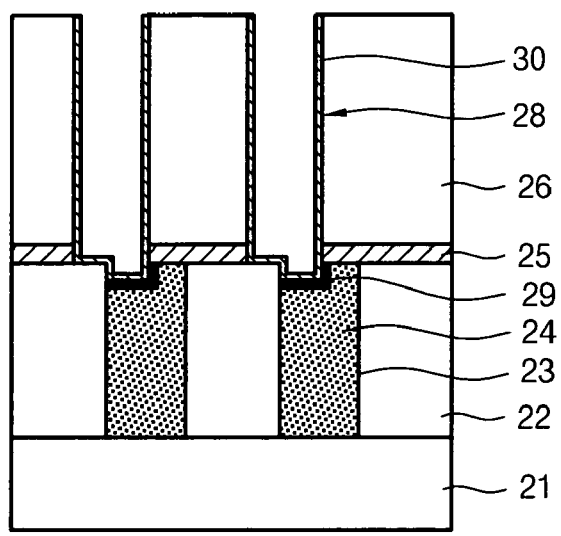

Referring to FIG. 2C, a metal silicide film 29 is formed on the surface of the etched storage node contact 24. The metal silicide film 29 realizes stable ohmic contact between a metal storage electrode and the storage node contact 24 made of polysilicon material and avoids a defect caused by diffusion of metal atoms from the metal storage electrode to the storage node contact 24. The metal silicide film 29 is formed on the interface between the storage node contact 24 made of polysilicon material and a transition metal film by depositing a transition metal film (not shown), such as Ti, Co, or Zr, on the surface of the etched storage node contact 24 and subjecting it to heat treatment. After the metal silicide film 29 is formed, any transition metal film which has not reacted is removed in wet etching.

A storage electrode metal film is deposited on the resulting substrate with a thickness of 50-1,000 Å in sputtering, CVD, or ALD mode and a part thereof deposited on the cap oxide film 26 is selectively removed to form a metal storage electrode 30 on the surface of the hole 28 including the metal silicide film 29. The metal storage electrode 30 is preferably made of TiN.

Figure 2D:
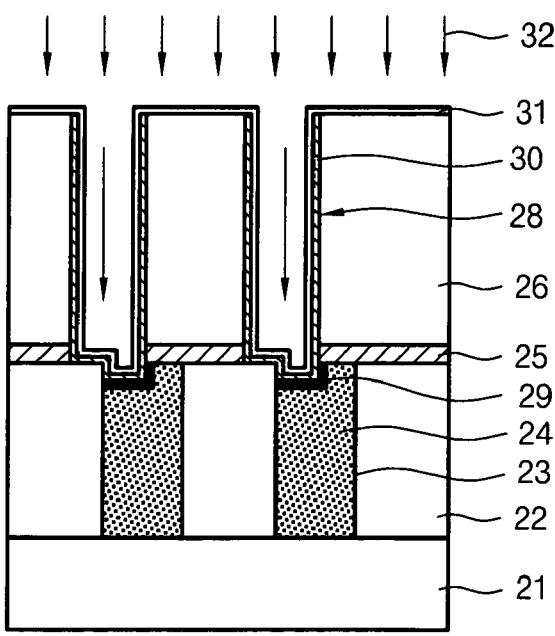

Referring to FIG. 2D, a single film made of $HfO_2$ or $Al_2O_3$ or a lamination film made of them is formed on the storage electrode 30 and the cap oxide film 26 as a dielectric film 31 having large dielectric constant. The dielectric film 31 is formed with a thickness of 50-400 Å in MOCVD or ALD mode.

The dielectric film 31 is then subject to $CF_4$ plasma treatment 32 for 60-3,600 seconds to improve the film quality thereof, particularly the interface characteristics between the dielectric film and the metal electrode. As will be described later in detail, the $CF_4$ plasma treatment on the dielectric film 31 improves the film quality thereof and secures both charging capacity (Cs) and leak current characteristics required in devices of 80 nm grade or below.

Figure 2E:
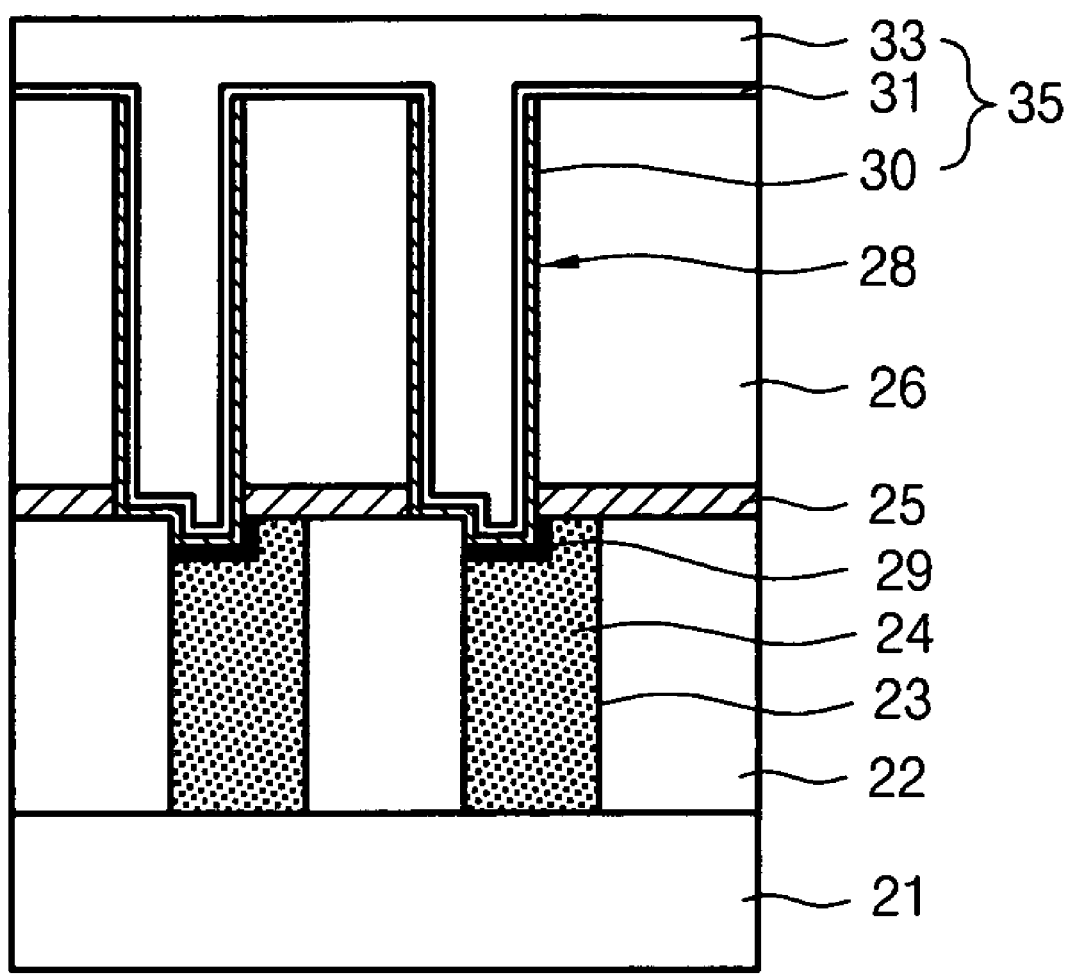

Referring to FIG. 2E, a metal plate electrode 32 is formed on the dielectric film 31 to complete the formation of an MIM capacitor 35 according to the present invention. The metal plate electrode 32 is formed with a thickness of 500-3,000 Å in sputtering, CVD, or ALD mode using any one of TiN and Ru.

As mentioned above, the inventive MIM capacitor has improved film quality by forming a dielectric film with a material having large dielectric constant and performing $CF_4$ plasma treatment on the dielectric film, so that both charging capacity (Cs) and leak current characteristics required in devices of 80 nm grade or below can be secured.

Figure 3A:
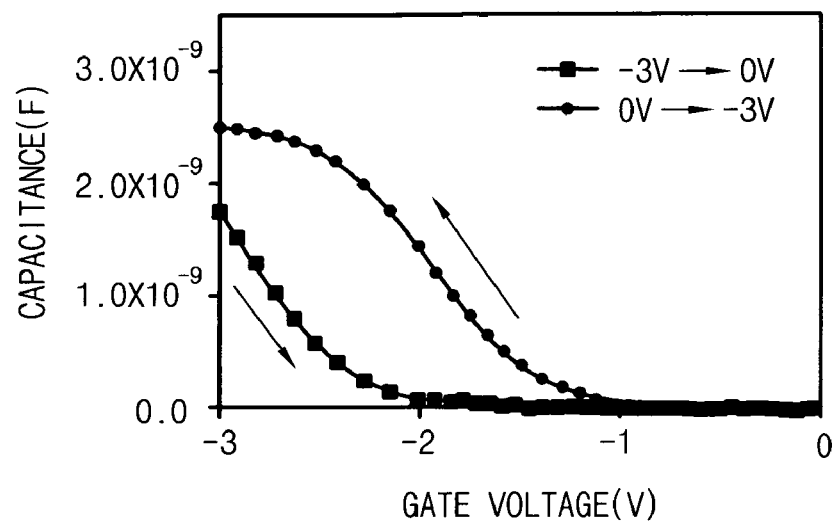
FIG. 3A is a graph showing C-V hysteresis characteristics when a dielectric film has not been subject to $CF_4$ plasma treatment.
Figure 3B:
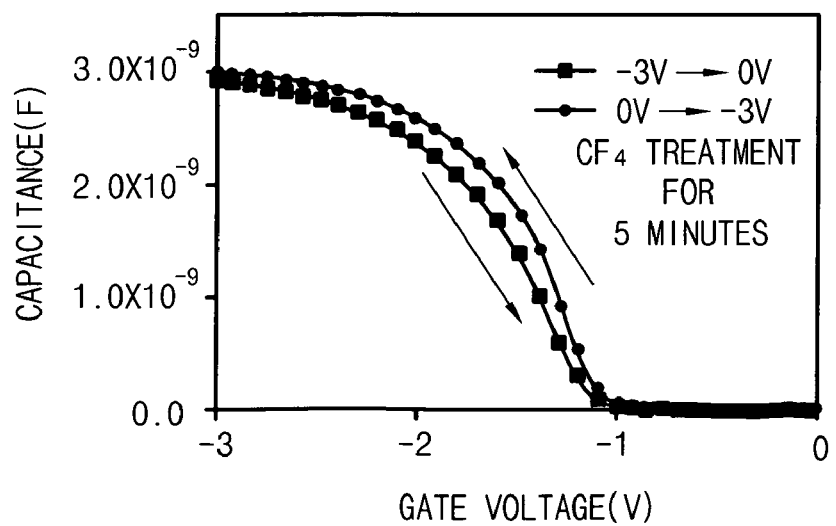
FIG. 3B is a graph showing C-V hysteresis characteristics when a dielectric film has been subject to $CF_4$ plasma treatment.

FIG. 3A is a graph showing C-V hysteresis characteristics when a dielectric film has not been subject to $CF_4$ plasma treatment and FIG. 3B is a graph showing C-V hysteresis characteristics when a dielectric film has been subject to $CF_4$ plasma treatment.

As shown, when a single film made of $HfO_2$ is deposited as a dielectric film and $CF_4$ plasma treatment is performed, fluoride (F) ions appears to decrease the interface trap density and the interface characteristics between the $HfO_2$ dielectric film and the metal electrode improves. As such, the present invention can improve leak current characteristics while securing sufficient charging capacity required in devices of 80 nm grade or below.

As mentioned above, the present invention can secure both charging capacity (Cs) and leak current characteristics as required by performing $CF_4$ plasma treatment on the dielectric film and improving the interface characteristics between the dielectric film and the metal electrode. It is then possible to manufacture a device having a capacitor which exhibits stable characteristics.

In addition, the present invention can improve the film quality of the dielectric film only through $CF_4$ plasma treatment without any modification of the material of the dielectric film, even when the design rule is further reduced in the future. It is then possible to easily manufacture a highly-integrated device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of a semiconductor device comprising the steps of:
providing a semiconductor substrate having a storage node contact;
forming a metal storage electrode on the substrate;
forming a dielectric film using any one chosen from a group comprising a single film made of $HfO_2$, a single film made of $Al_2O_3$, and a lamination film of made of $HfO_2$ and $Al_2O_3$ on the metal storage electrode;
performing $CF_4$ plasma treatment on the dielectric film wherein the performing step is not an etching procedure but rather the performing step is a treatment procedure on the dielectric film that results in improving leak current characteristics of the dielectric film while securing sufficient charging capacity of the capacitor; and
forming a metal plate electrode on the dielectric film.

2. The method for forming a capacitor of a semiconductor device as claimed in claim 1, wherein the storage node contact is made of polysilicon having a metal silicide film on a surface thereof.

3. The method for forming a capacitor of a semiconductor device as claimed in claim 1, wherein the metal storage electrode is made of TiN.

4. The method for forming a capacitor of a semiconductor device as claimed in claim 1, wherein the metal storage electrode is formed with a thickness of 50-1000 Å in any mode chosen from a group comprising sputtering mode, Chemical Vapor Deposition (CVD) mode, and Atomic Layer Deposition (ALD) mode.

5. The method for forming a capacitor of a semiconductor device as claimed in claim 1, wherein the dielectric film is formed with a thickness of 50-400 Å in Metal Oxide Chemical Vapor Deposition (MOCVD) or Atomic Layer Deposition (ALD) mode.

6. The method for forming a capacitor of a semiconductor device as claimed in claim 1, wherein the $CF_4$ plasma treatment is performed for 60-3600 seconds.

7. The method for forming a capacitor of a semiconductor device as claimed in claim 1, wherein the metal plate electrode is made of TiN or Ru.

8. The method for forming a capacitor of a semiconductor device as claimed in claim 1, wherein the metal plate electrode is formed with a thickness of 500-3000 Å in any mode chosen from a group comprising sputtering mode, Chemical Vapor Deposition (CVD) mode, and Atomic Layer Deposition (ALD) mode.

9. A method for forming a capacitor of a semiconductor device comprising the steps of:
providing a semiconductor substrate having a storage node contact of polysilicon material;
forming a cap oxide film on the substrate;
etching the cap oxide film to form a hole which exposes the storage node contact;
forming a metal silicide film on the surface of the exposed storage node contact;
forming a metal storage electrode on the surface of the hole including the metal silicide film; of $HfO_2$ and $Al_2O_3$
forming a dielectric film using any one chosen from a group comprising a single film made of $HfO_2$, a single film made of $Al_2O_3$, and a lamination film made of $HfO_2$ and $Al_2O_3$ on the metal storage electrode;
performing $CF_4$ plasma treatment on the dielectric film wherein the performing step is not an etching procedure but rather the performing step is a treatment procedure on the dielectric film that results in improving leak current characteristics of the dielectric film while securing sufficient charging capacity of the capacitor; and
forming a metal plate electrode on the dielectric film.

10. The method for forming a capacitor of a semiconductor device as claimed in claim 9, wherein the metal storage electrode is made of TiN.

11. The method for forming a capacitor of a semiconductor device as claimed in claim 9, wherein the metal storage electrode is formed with a thickness of 50-1000 Å in any mode chosen from a group comprising sputtering mode, Chemical Vapor Deposition (CVD) mode, and Atomic Layer Deposition (ALD) mode.

12. The method for forming a capacitor of a semiconductor device as claimed in claim 9, wherein the dielectric film is formed with a thickness of 50-400 Å in Metal Oxide Chemical Vapor Deposition (MOCVD) or (Atomic Layer Deposition (ALD) mode.

13. The method for forming a capacitor of a semiconductor device as claimed in claim 9, wherein the $CF_4$ plasma treatment is performed for 60-3600 seconds.

14. The method for forming a capacitor of a semiconductor device as claimed in claim 9, wherein the metal plate electrode is formed with a thickness of 500-3000 Å in any mode chosen from a group comprising sputtering mode, (Chemical Vapor Deposition (CVD) mode, and Atomic Layer Deposition (ALD) mode.

15. The method for forming a capacitor of a semiconductor device as claimed in claim 9, wherein the metal plate electrode is made of TIN or Ru.

* * * * *